(12) United States Patent
Chen (10) Patent No.: US 10,051,759 B1
(45) Date of Patent: Aug. 14, 2018

(54) SERVER SLIDE RAIL ASSEMBLY FRONT BRACKET QUICK RELEASE STRUCTURE (71) Applicant: GSLIDE CORPORATION, New Taipei (TW)

(72) Inventor: Yung-Liang Chen, Taipei Shien (TW)

(73) Assignee: GSLIDE CORPORATION, New Taipei (TW)

( * ) Notice: Subject to any disclaimer, the term of this patent is extended or adjusted under 35 U.S.C. 154(b) by 0 days.

(21) Appl. No.: 15/920,644

(22) Filed: Mar. 14, 2018

(30) Foreign Application Priority Data

Apr. 24, 2017 (TW) .............................. 106113606 A (51) Int. Cl.
A47B 96/06 (2006.01)
H05K 7/14 (2006.01)
A47B 57/48 (2006.01)
A47B 57/54 (2006.01)
H05K 7/18 (2006.01)

(52) U.S. Cl.
CPC .......... H05K 7/1489 (2013.01); A47B 57/485 (2013.01); A47B 57/545 (2013.01); H05K 7/183 (2013.01)

(58) Field of Classification Search
CPC ..... A47B 57/485; A47B 57/545; A47B 88/43; A47B 88/407; A47B 88/044; A47B 96/06; H05K 7/1489; H05K 7/183
USPC ...................................................... 248/219.1
See application file for complete search history.

(56) References Cited

U.S. PATENT DOCUMENTS

| 7,703,734 | B2* | 4/2010 | Chen ...................... A47B 88/43 108/108 |
| 8,602,225 | B2* | 12/2013 | Lin ........................ A47B 88/43 211/26 |
| 9,125,489 | B2* | 9/2015 | Chen .................... A47B 88/044 |
| 9,370,120 | B2* | 6/2016 | Chen .................... A47B 96/025 |
| 9,480,183 | B2* | 10/2016 | Chen .................... H05K 7/1489 |
| 9,670,956 | B2* | 6/2017 | Judge ..................... F16C 29/04 |
| 9,801,467 | B2* | 10/2017 | Chen .................... H05K 7/1489 |
| 9,854,908 | B1* | 1/2018 | Tang .................... H05K 7/1489 |
| 2011/0192946 | A1* | 8/2011 | Yu ........................ H05K 7/1489 248/222.11 |
| 2011/0240580 | A1* | 10/2011 | Yu ........................ H05K 7/1489 211/183 |

(Continued)

FOREIGN PATENT DOCUMENTS

| TW | I305138 B | 1/2009 |
| TW | M427756 U | 4/2012 |
| TW | I573518 B | 3/2017 |

Primary Examiner — Monica E Millner
(74) Attorney, Agent, or Firm — Cook Alex Ltd.

(57) ABSTRACT

A server sliding rail assembly front bracket quick release structure includes a front bracket connected to an outer sliding rail of a server sliding rail assembly, a connecting seat connected to the front bracket, a plurality of sockets supported on respective coil springs in the connecting seat, a plurality of locating pins respectively inserted through the sockets and the coil springs, a swivel buckle pivotally connected to the front bracket and biasable to hook a hook plate thereof on a rack wall of a server rack after insertion of the sockets or locating pins into respective locating holes on the rack wall of the server, and a torsion spring with one side thereof stopped against the swivel buckle and an opposite side thereof stopped against the connecting seat.

7 Claims, 13 Drawing Sheets (56) References Cited

U.S. PATENT DOCUMENTS

2012/0193489 A1\* 8/2012 Yu ..................... H05K 7/1489
 248/201
2018/0098626 A1 4/2018 Chen et al.

\* cited by examiner

SERVER SLIDE RAIL ASSEMBLY FRONT BRACKET QUICK RELEASE STRUCTURE

BACKGROUND OF THE INVENTION

Field of the Invention

The present invention relates to server sliding rail technology and more particularly, to a server sliding rail assembly front bracket quick release structure, which facilitates quick mounting and dismounting without tools and which is applicable to different server racks with different designs of locating holes.

Description of the Related Art

Taiwan Patent I305138 discloses a front dismounting type sliding rail bracket for mounting a sliding rail assembly to a server rack. This design is applicable to a server rack having a predetermined specification. Other bracket designs for mounting a sliding rail assembly to a server rack are seen in Taiwan Patent I573518, invented by the present inventor and entitled "Bracket device for server sliding rail assembly", and Taiwan Patent I1427756, invented by the present inventor and entitled "Server and data machine bearing storage rack slide rail holder".

SUMMARY OF THE INVENTION

The present invention overcomes disadvantages of the prior art. It is an object of the present invention to provide a server sliding rail assembly front bracket quick release structure, which facilitates quick mounting and dismounting of a server sliding rail assembly to or from a server rack without tools.

In a first aspect, a server sliding rail assembly front bracket quick release structure is disclosed. The server sliding rail assembly front bracket quick release structure includes a front bracket comprising a base wall, upper and lower walls respectively connected to opposing upper and lower sides of the base wall, the base wall being configured to be connected to a front side of an outer sliding rail of a server sliding rail assembly. The server sliding rail assembly front bracket quick release structure also has a connecting seat that includes a first wall fixedly connected to the base wall of the front bracket, a second wall perpendicularly connected at a bottom side thereof to a rear side of the first wall, a third wall perpendicularly connected to an opposing top side of the second wall, a fourth wall perpendicularly connected to the third wall, an accommodation chamber defined between the fourth wall and the second wall, a plurality of locating holes through the fourth wall, and a plurality of holes through the second wall. A plurality of sockets are respectively disposed in the accommodation chamber between the second wall and the fourth wall, each socket including a stop flange extended around the periphery thereof and stopped at an inner surface of the fourth wall around one respective locating hole. A plurality of coil springs are respectively supported between the sockets and the second wall within the accommodation chamber to force the respective sockets into the respective locating holes through the fourth wall. A plurality of locating pins are respectively inserted through the sockets and the coil springs, each locating pin having one end thereof fastened to one respective hole through the second wall and an opposite end thereof extended out of one respective locating hole through the fourth wall. Also included is a swivel buckle having two lugs bilaterally disposed at a rear side thereof and respectively pivotally connected to the upper and lower walls of the front bracket with a pivot member, a hook plate located at an opposing front side of the swivel buckle, and a lever extended from the hook plate; and a torsion spring mounted around the pivot member to force the swivel buckle into abutment against the connecting seat, the torsion spring having one side stopped against the swivel buckle and an opposite side thereof stopped against the first wall of the connecting seat.

In a second aspect, to achieve the objects of the present invention, a server sliding rail assembly front bracket quick release structure includes a front bracket, which has a base wall, upper and lower walls respectively connected to opposing upper and lower sides of the base wall, a plurality of first holes through the base wall used to connected the base wall to a front side of an outer sliding rail of a server sliding rail assembly via first rivets, and a plurality of third holes through the base wall at a front side relative to the first holes through the base wall.

The server sliding rail assembly front bracket quick release structure also includes a connecting seat, which includes a first wall, a plurality of second holes through the first wall of the connecting seat used to respectively fixedly connect the base wall at the third holes through the front bracket via second rivets, a second wall perpendicularly connected at a bottom side thereof to a rear side of the first wall, a third wall perpendicularly connected to an opposing top side of the second wall, a fourth wall perpendicularly connected to the third wall, an accommodation chamber defined between the fourth wall and the second wall, a plurality of locating holes through the fourth wall, and a plurality of fourth holes through the second wall.

A plurality of sockets are respectively disposed in the accommodation chamber between the second wall and the fourth wall, with each socket having a stop flange extended around the periphery thereof and stopped at an inner surface of the fourth wall around one respective locating hole. A plurality of coil springs are respectively supported between the sockets and the second wall within the accommodation chamber to force the respective sockets into the respective locating holes through the fourth wall. A plurality of locating pins are respectively inserted through the sockets and the coil springs, each locating pin having one end thereof fastened to one respective fourth hole through the second wall and an opposite end thereof extended out of one respective locating hole through the fourth wall.

The server sliding rail assembly front bracket quick release structure further includes a swivel buckle, which includes two lugs bilaterally disposed at a rear side thereof and respectively pivotally connected to the upper and lower walls of the front bracket with a pivot member, a hook plate located at an opposing front side of the swivel buckle and adapted for hooking on a front side of a rack wall of a server rack after insertion of the sockets or locating pins into respective locating holes on the rack wall of the server rack, and a lever extended from the hook plate for operation by the user to bias the swivel buckle relative to the front bracket. A torsion spring is mounted around the pivot member to force the swivel buckle into abutment against the connecting seat with the torsion spring having one side stopped against the swivel buckle and an opposite side thereof stopped against the first wall of the connecting seat.

To mount the server sliding rail assembly to the server rack, the lever is biased to disengage the swivel buckle from the connecting seat, the sockets or the locating pins then are inserted into respective locating holes on the rack wall of the server rack, the fourth wall of the connecting seat then is forced into abutment against a back surface of the rack wall of the server rack, and the swivel buckle then is released to enable the hook plate to hook on an opposing front surface of the rack wall of the server rack.

To dismount the server sliding rail assembly from the server rack, the lever is biased to disengage the hook plate from the server rack to allow removal of the sockets or the locating pins of the connecting seat from the locating holes of the server rack.

Thus, after installation, the fourth wall of the connecting seat is abutted against the back surface of the rack wall of the server rack, the hook plate of the swivel buckle is hooked on the front surface of the rack wall of the server rack, and the sockets or locating pins are respectively engaged into the rack wall of the server rack, enhancing connection stability.

Further, the swivel buckle can be biased and disconnected from the rack wall of the server rack conveniently without tools.

Still further, by means of the sockets or locating pins of the connecting seat, the connecting seat can be fastened to large locating holes (for example, square locating holes) or small locating holes (for example, circular locating holes) of a server rack.

DETAILED DESCRIPTION OF THE PREFERRED EMBODIMENT

Figure 3:
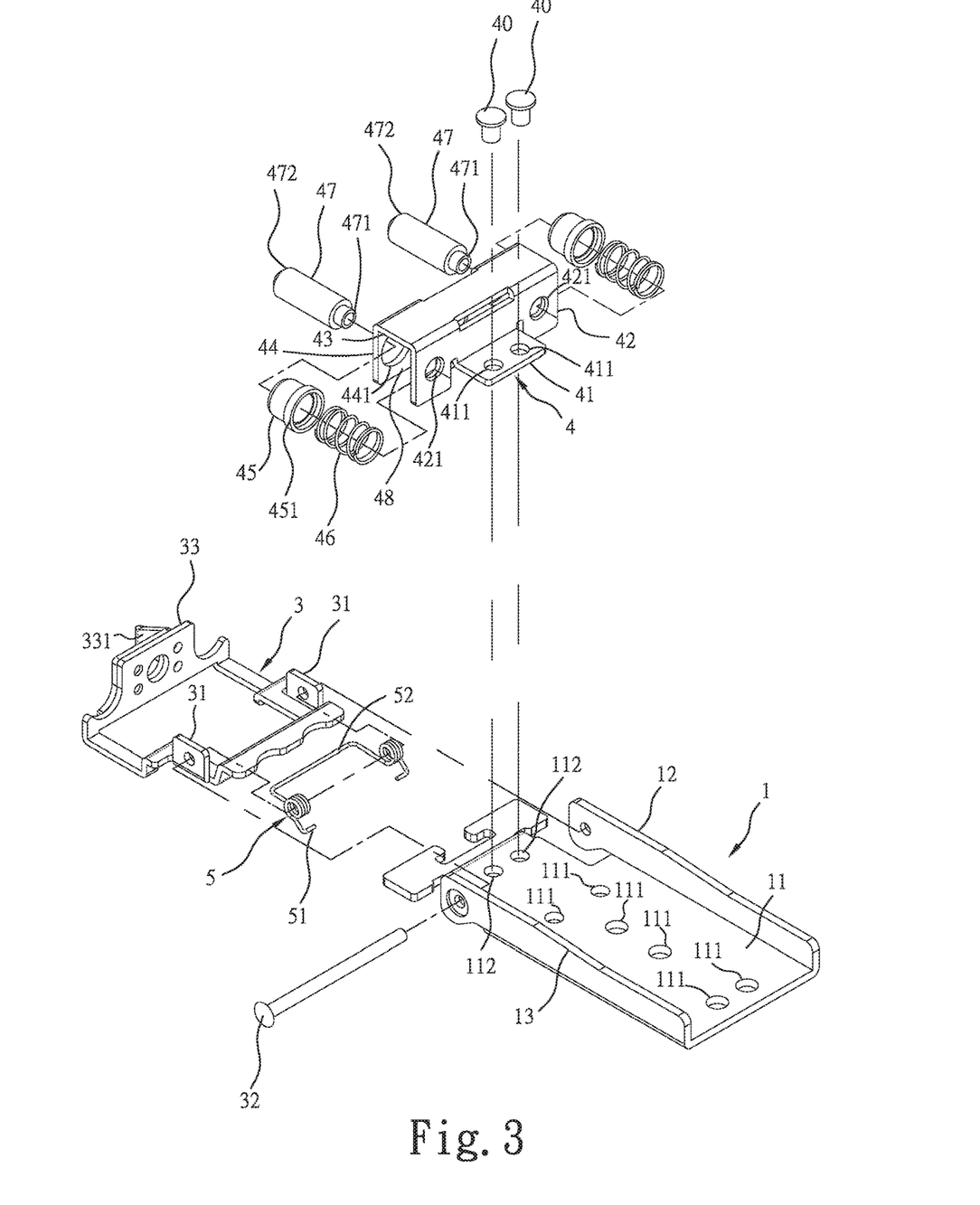
FIG. 3 is an exploded perspective view of the assembly in FIG. 1, when viewed from the angle in FIG. 2.
Figure 4:
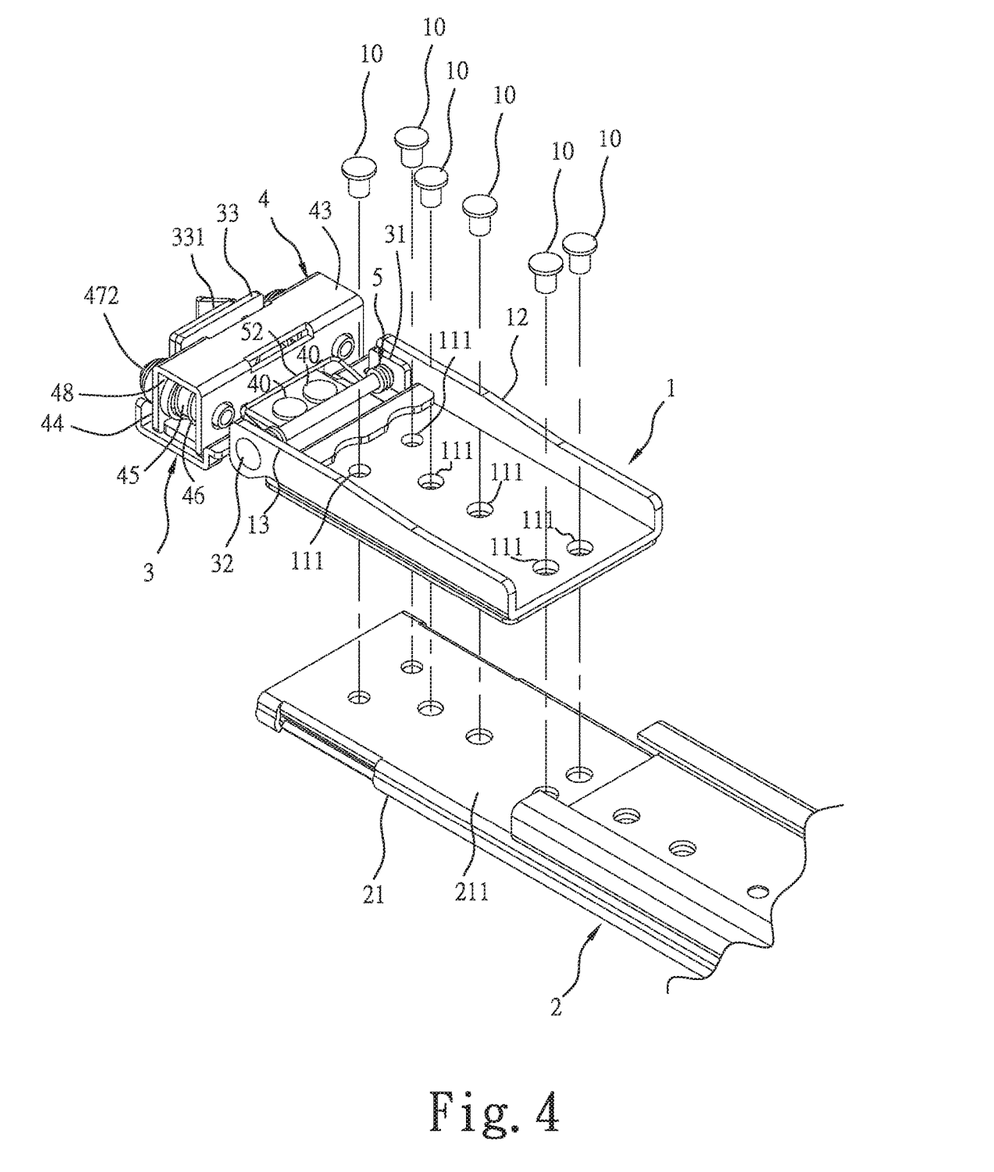
FIG. 4 is a partial exploded perspective view of the assembly in FIG. 1 and illustrating the relationship to a server sliding rail assembly, when viewed from the angle in FIG. 2.
Figure 5:
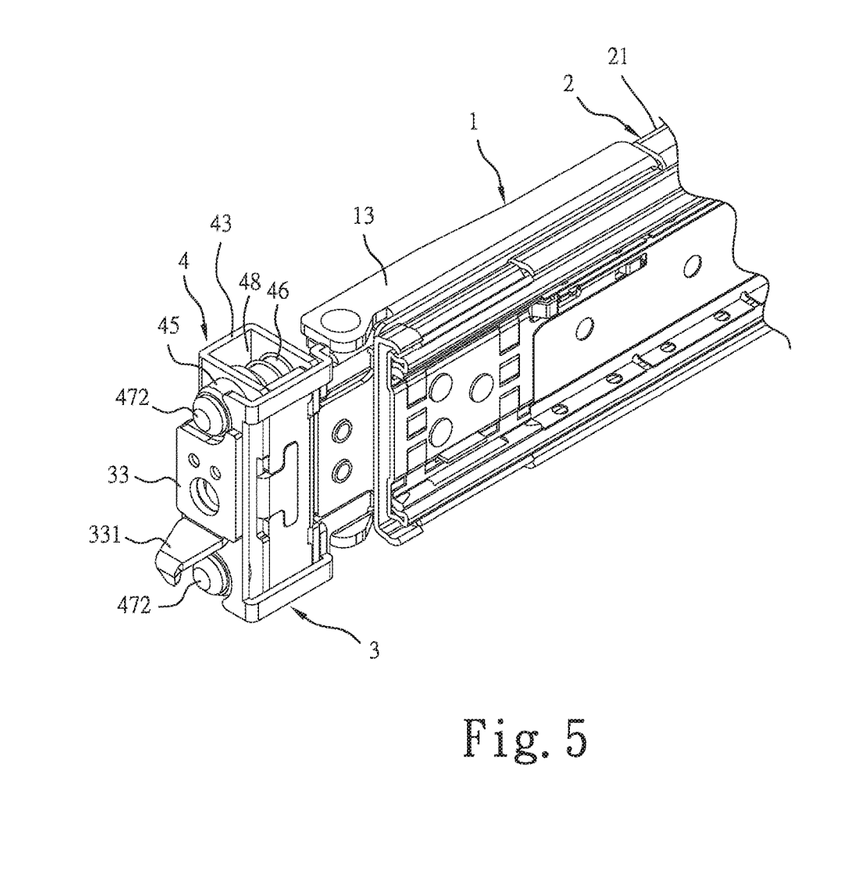
FIG. 5 is a perspective view of the assembly in FIG. 4, when viewed from another angle.
Figure 6:
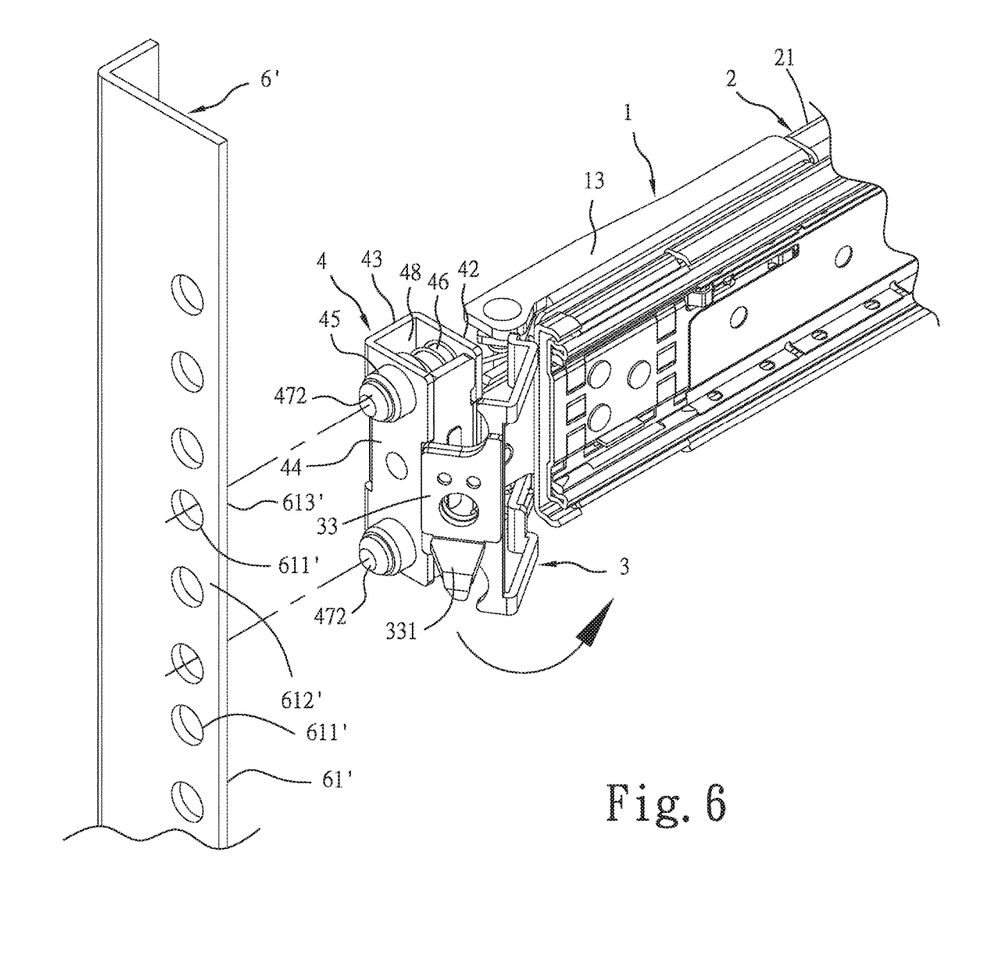
FIG. 6 is a partial exploded view of the assembly in FIG. 5 and illustrating a swivel buckle biased and opened before installation in a server rack.
Figure 7:
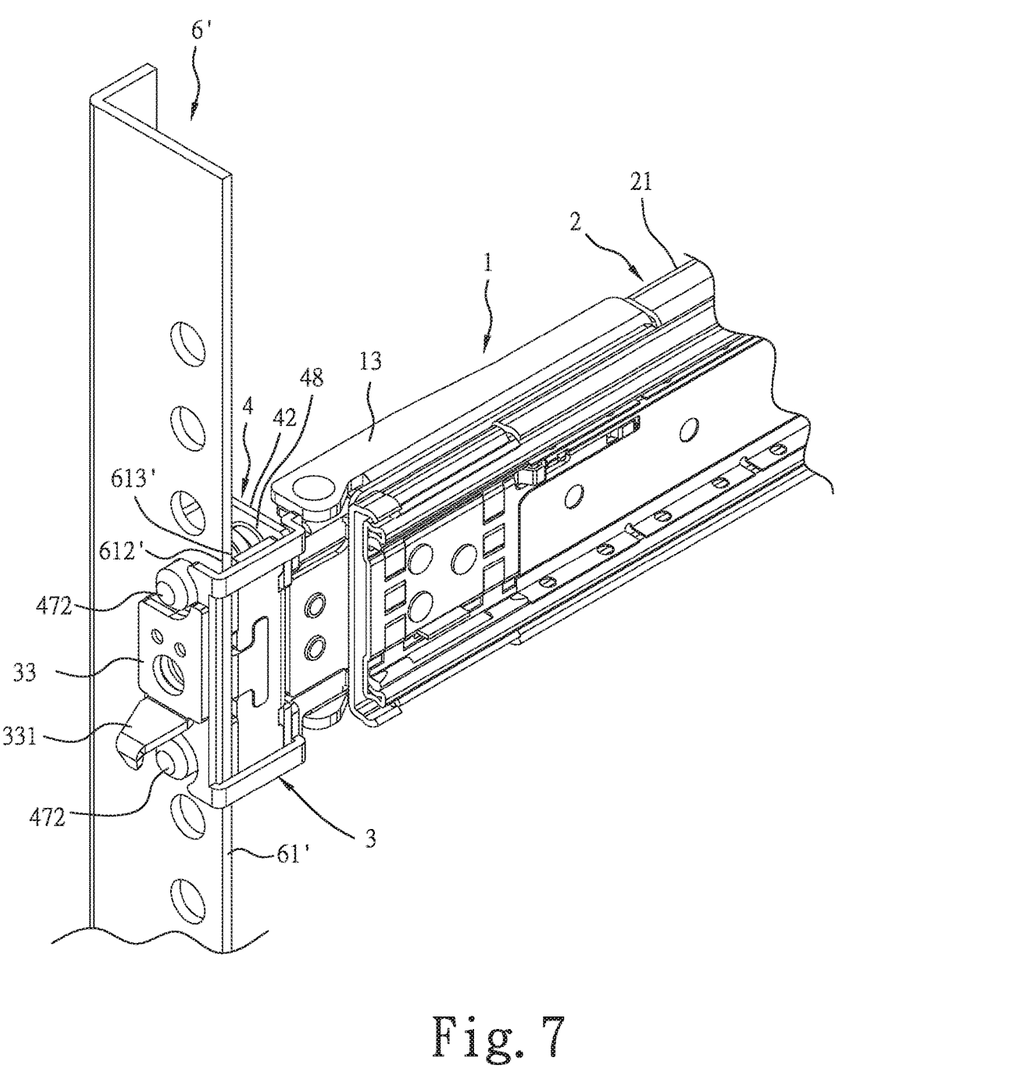
FIG. 7 is a perspective view of the assembly in FIG. 6 after installation to a server rack with small locating holes.
Figure 8:
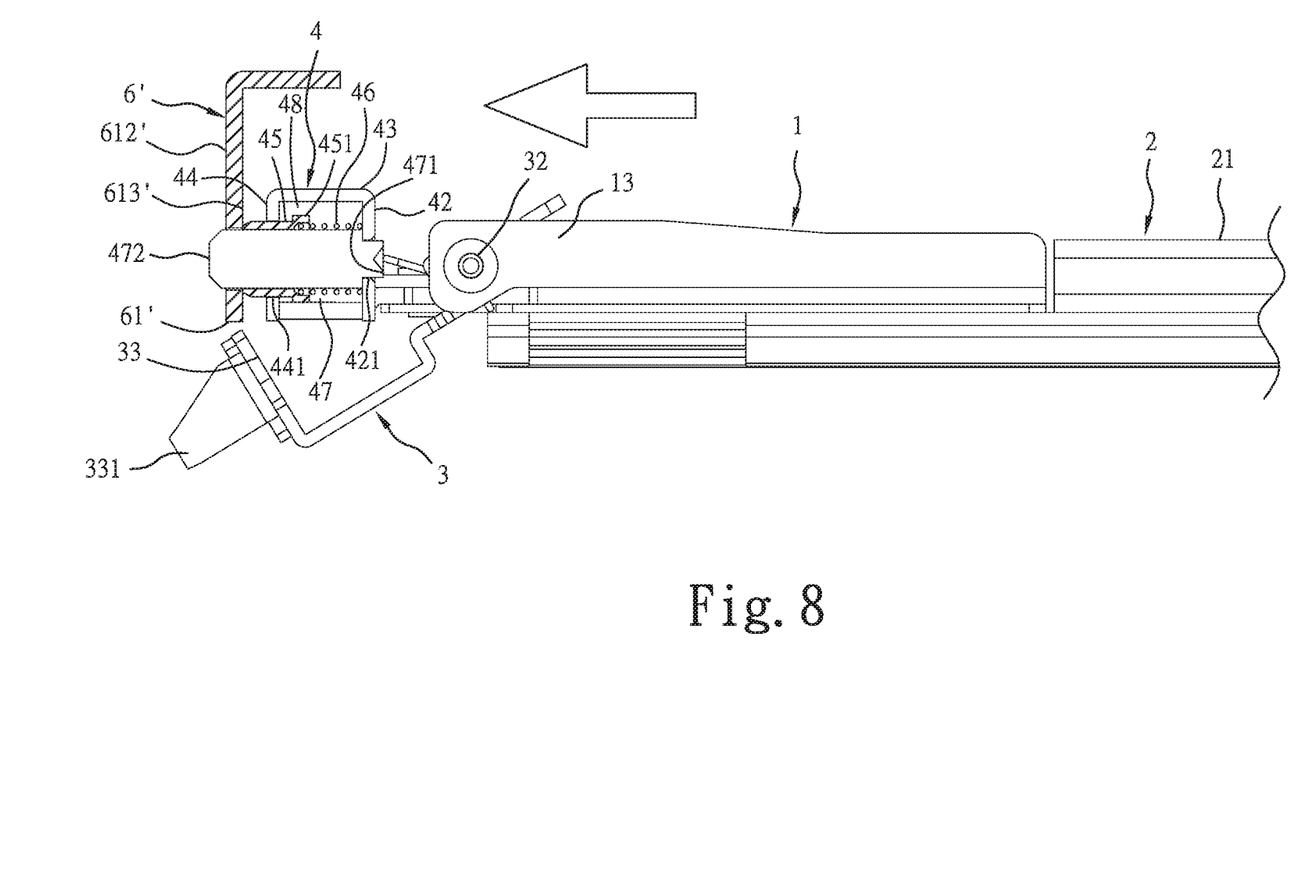
FIG. 8 is a schematic partial cross-sectional top view illustrating the swivel buckle of the assembly in FIG. 6 biased and opened, and having locating pins inserted into respective small locating holes of the server rack.
Figure 9:
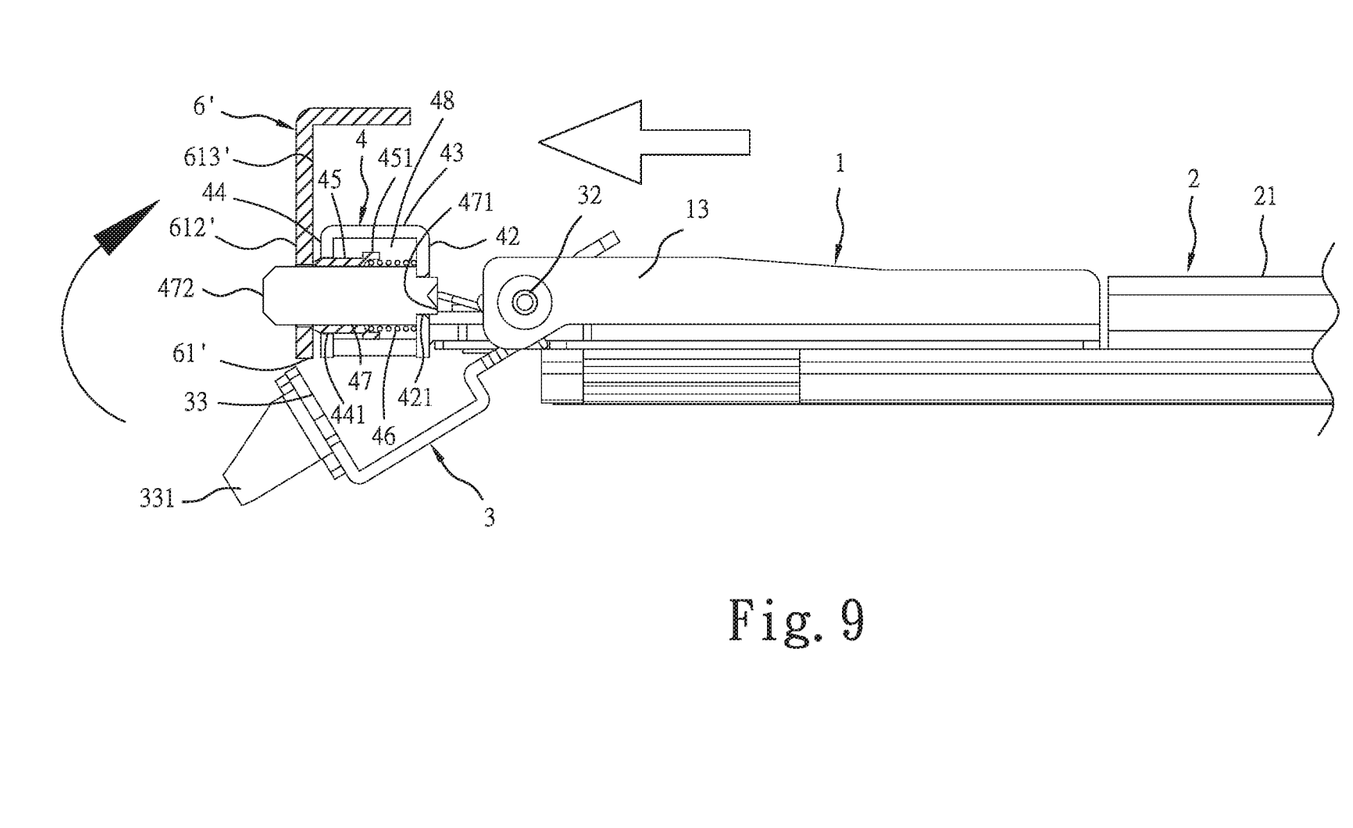
FIG. 9 is a schematic partial cross-sectional top view illustrating the swivel buckle of the assembly in FIG. 8 biased and opened, and having the locating pins inserted into respective small locating holes of the server rack and the coil springs compressed by the respective sockets.

Referring to FIGS. 1-13, a server sliding rail assembly front bracket quick release structure in accordance with the present invention is shown. The server sliding rail assembly front bracket quick release structure includes a front bracket 1, having a base wall 11, upper and lower walls 12 and 13 respectively connected to opposing upper and lower sides of the base wall 11, a plurality of first holes 111 through the base wall 11 (see FIGS. 3 and 4) and being configured to be connected to a front side 211 of an outer sliding rail 21 of a server sliding rail assembly 2 (see FIG. 4) via first rivets 10, and a plurality of third holes 112 through the base wall 11 at a front side relative to the first holes 111 through the base wall 11 (see FIG. 3).

The server sliding rail assembly front bracket quick release structure also includes a connecting seat 4 including a first wall 41, a plurality of second holes 411 through the first wall 41 of the connecting seat 4 and respectively fixedly connected to the base wall 11 at the third holes 112 through the front bracket 1 via second rivets 40 (see FIG. 3), a second wall 42 perpendicularly connected at a bottom side thereof to a rear side of the first wall 41, a third wall 43 perpendicularly connected to an opposing top side of the second wall 42, a fourth wall 44 perpendicularly connected to the third wall 43, an accommodation chamber 48 defined between the fourth wall 44 and the second wall 42 (see FIG. 3), a plurality of locating holes 441 through the fourth wall 44, and a plurality of fourth holes 421 through the second wall 42; a plurality of sockets 45 respectively disposed in the accommodation chamber 48 between the second wall 42 and the fourth wall 44, each socket 45 having a stop flange 451 extended around the periphery thereof and stopped at an inner surface of the fourth wall 44 around one respective locating hole 441; a plurality of coil springs 46 respectively supported between the sockets 45 and the second wall 42 within the accommodation chamber 48 to force the respective sockets 45 into the respective locating holes 441 through the fourth wall 44; a plurality of locating pins 47 respectively inserted through the sockets 45 and the coil springs 46, each locating pin 47 having one end 471 thereof fastened to one respective fourth hole 421 through the second wall 42 and an opposite end 472 thereof extended out of one respective locating hole 441 through the fourth wall.

Figure 1:
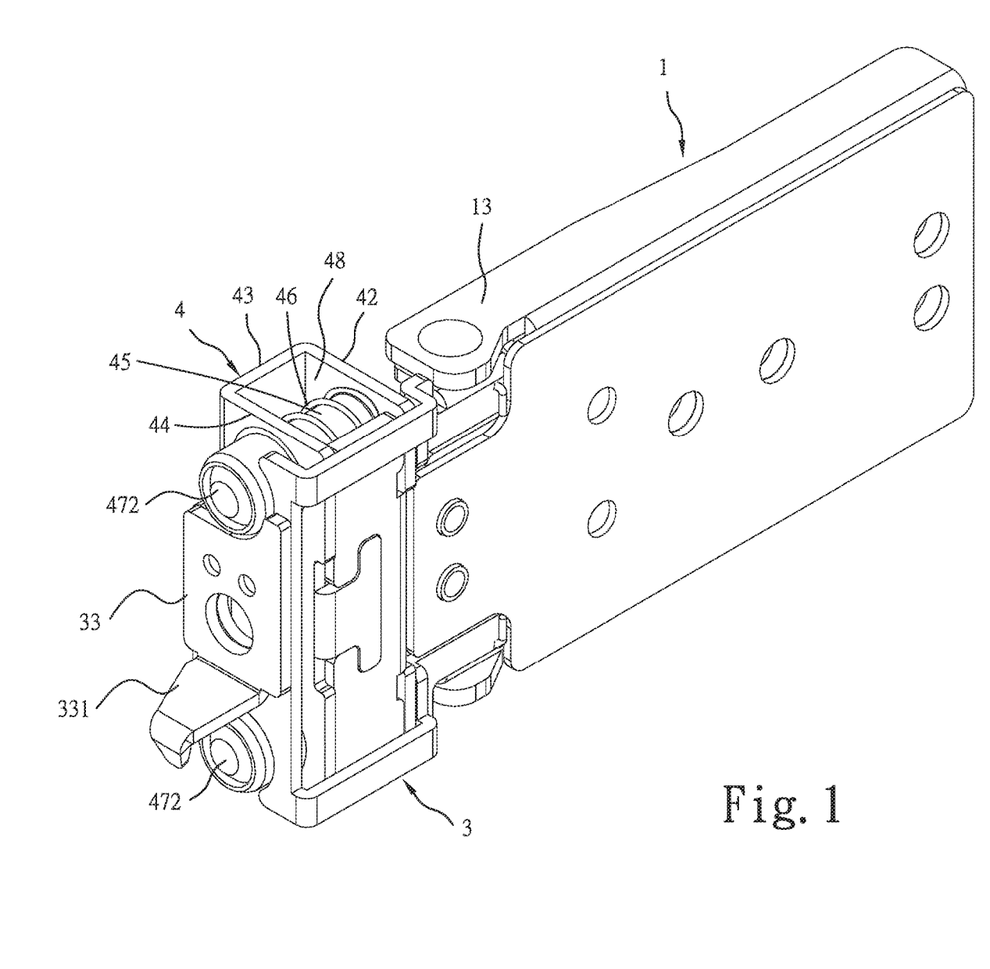
FIG. 1 is a perspective view of a server sliding rail assembly front bracket quick release structure in accordance with the present invention.
Figure 2:
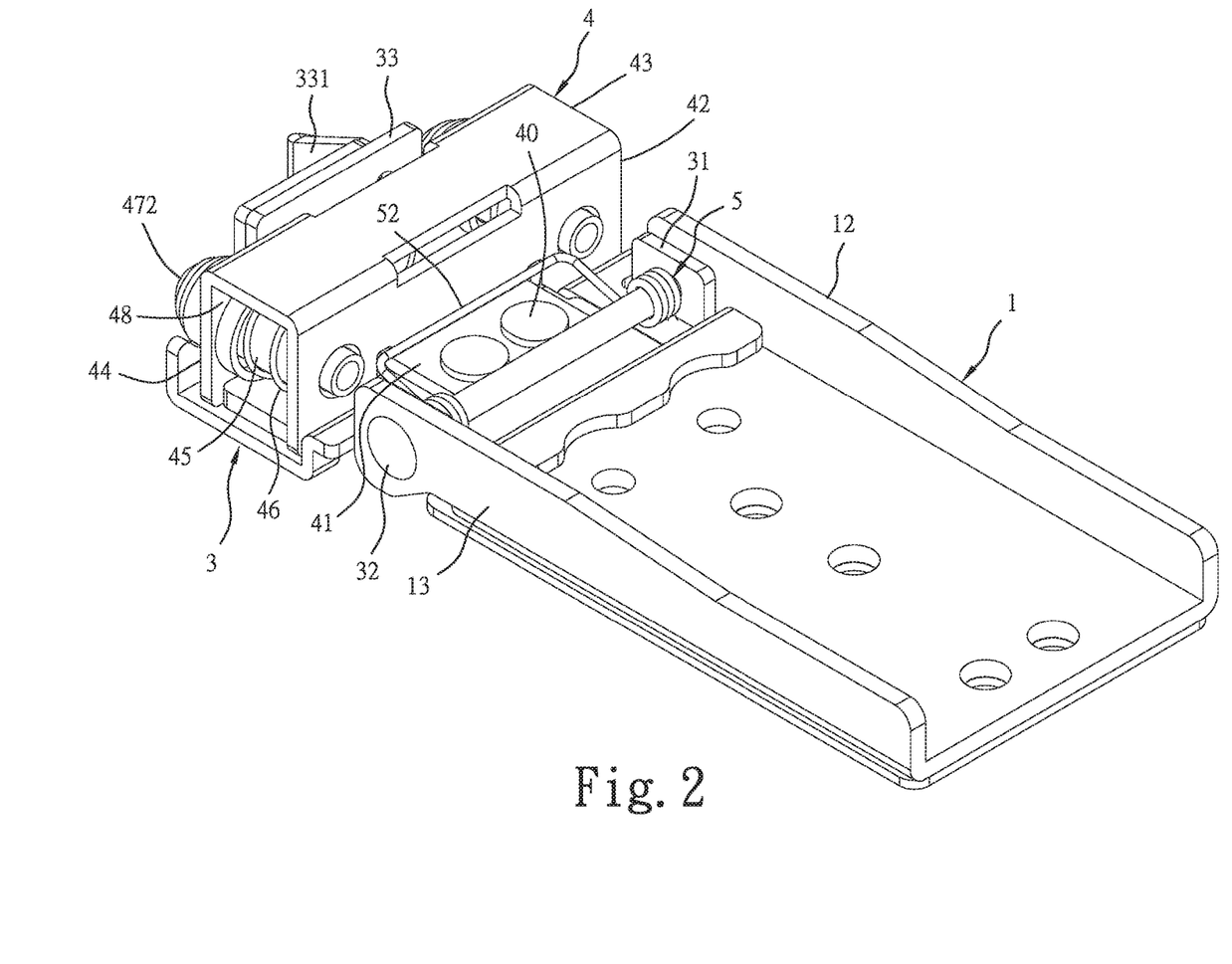
FIG. 2 is a perspective view of the assembly shown in FIG. 1 when viewed from another angle.

The server sliding rail assembly front bracket quick release structure further includes a swivel buckle 3, which includes two lugs 31 bilaterally disposed at a rear side thereof and respectively pivotally connected to the upper and lower walls 12, 13 of the front bracket 1 with a pivot member 32 (see FIG. 3), a hook plate 33 located at an opposing front side of the swivel buckle 3 and adapted for hooking on a front side 612, 612' of a rack wall 61, 61' of a server rack 6, 6' (see FIGS. 6-13) after insertion of the sockets 45 or locating pins 47 into respective locating holes 611, 611' on the rack wall 61, 61' of the server rack 6, 6', and a lever 331 extended from the hook plate 33 for operation by the user to bias the swivel buckle 3 relative to the front bracket 1; and a torsion spring 5 mounted around the pivot member 32 to force the swivel buckle 3 into abutment against the connecting seat 4 (see FIG. 4), the torsion spring 5 having one side 51 stopped against the swivel buckle 3 and an opposite side 52 thereof stopped against the first wall 41 of the connecting seat 4 (see FIG. 2).

Figure 13:
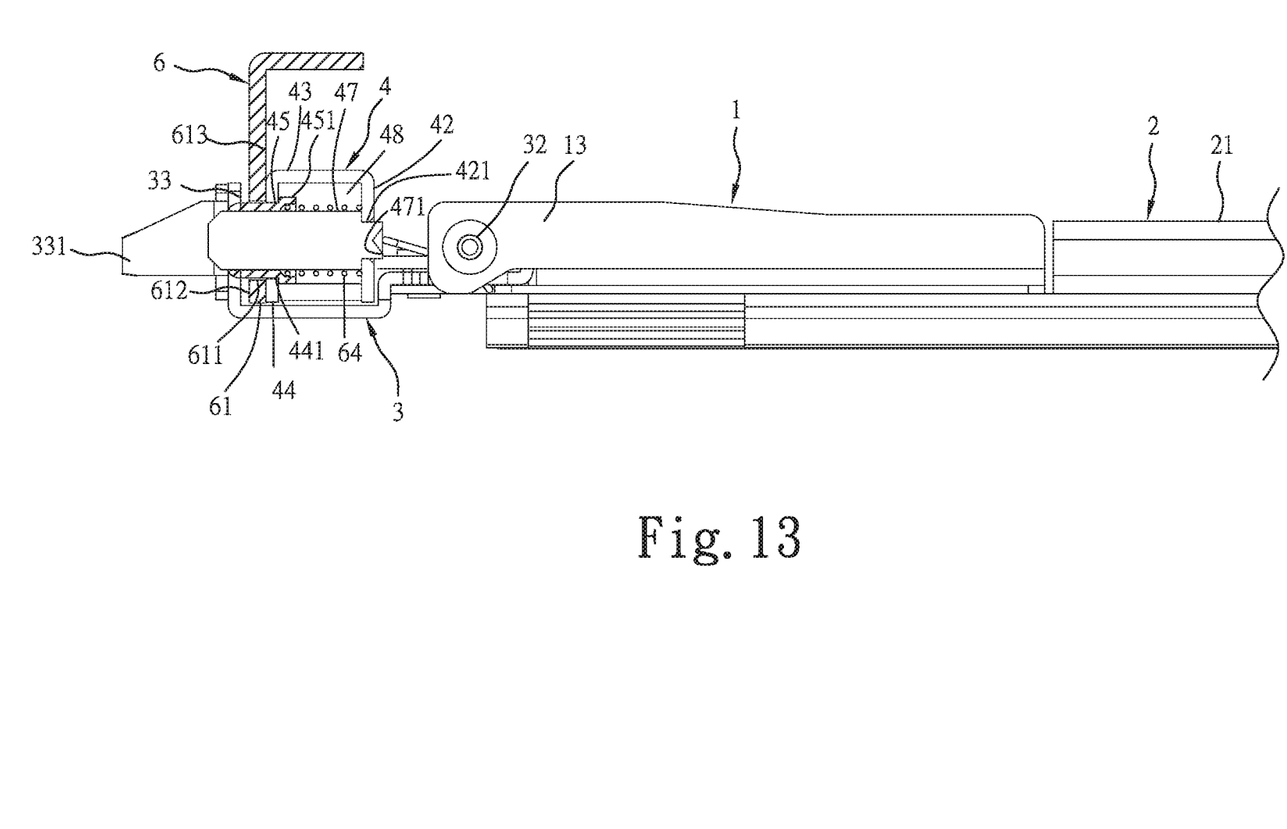
FIG. 13 is a schematic partial cross-sectional top view illustrating the assembly in FIG. 11 installed in the server rack with large locating holes.

To mount the server sliding rail assembly 2 to a server rack 6 with large locating holes 611, the lever 331 is biased to disengage the swivel buckle 3 from the connecting seat 4 (see FIGS. 6, 8 and 11), the sockets 45 then are inserted into respective large locating holes 611 on a rack wall 61 of the server rack 6 (see FIG. 12), and the fourth wall 441 of the connecting seat 4 then is forced into abutment against a back surface 613 of the rack wall 61 of the server rack 6 (see FIG. 13), and the swivel buckle 3 then is released to enable the hook plate 33 to hook on an opposing front surface 612 of the rack wall 61 of the server rack 6 (see FIG. 13).

Figure 10:
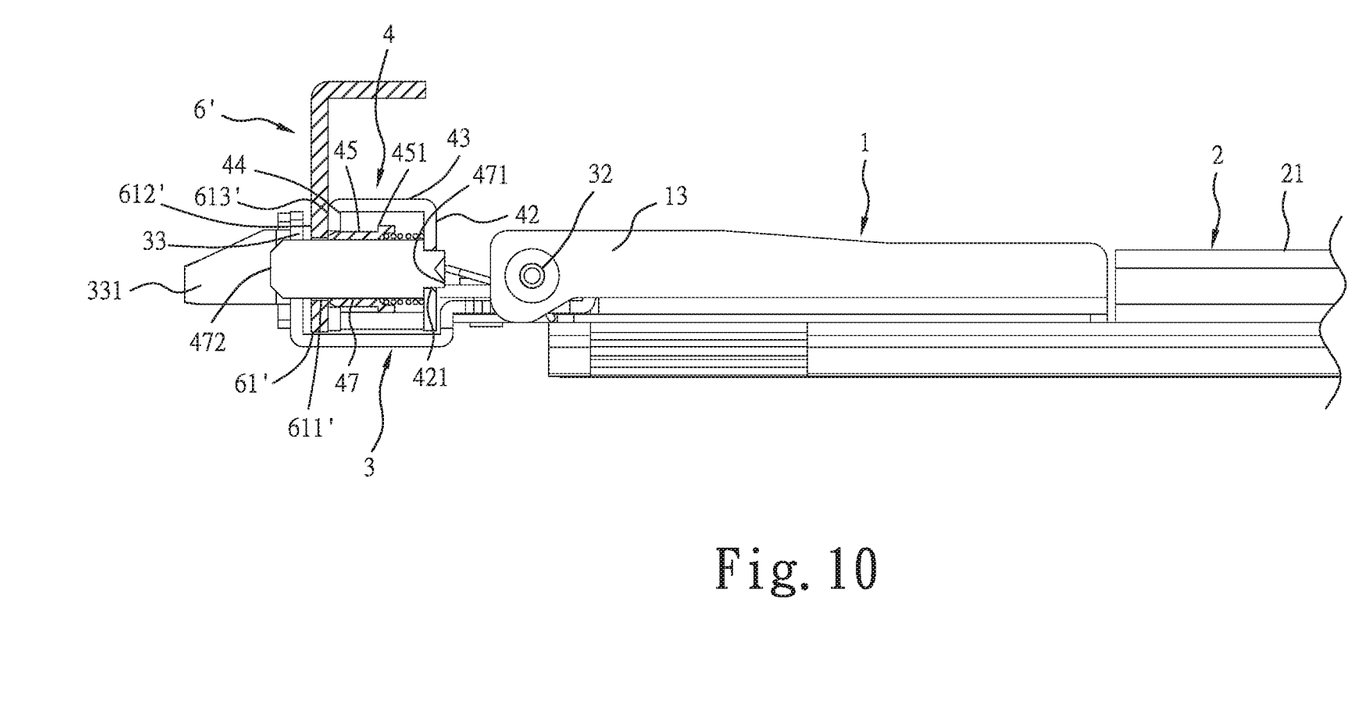
FIG. 10 is a schematic partial cross-sectional top view illustrating the assembly in FIG. 8 installed in the server rack with small locating holes.
Figure 11:
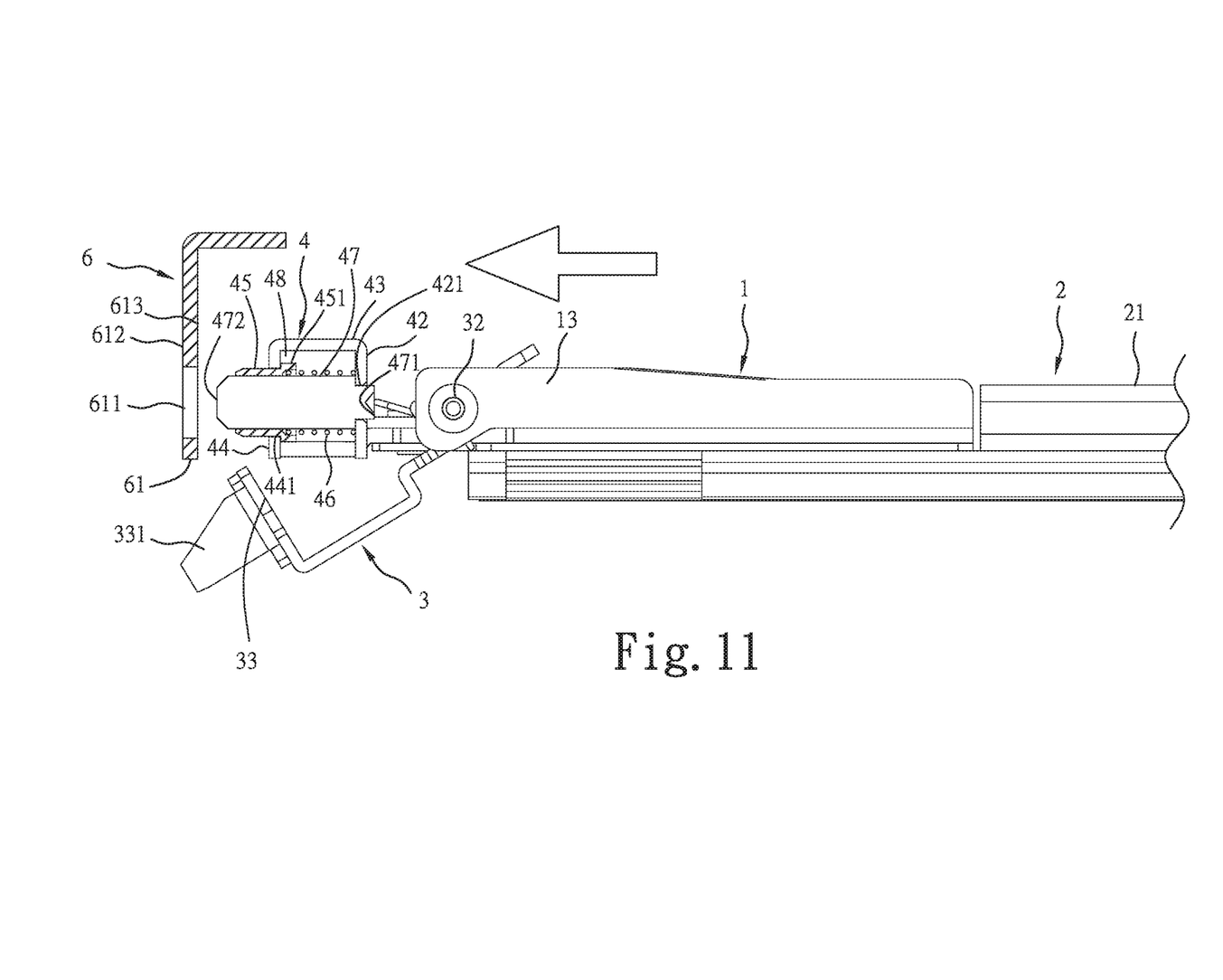
FIG. 11 is a schematic partial cross-sectional top view illustrating the swivel buckle of the assembly in FIG. 8 biased and opened before installation in a server rack with large locating holes.
Figure 12:
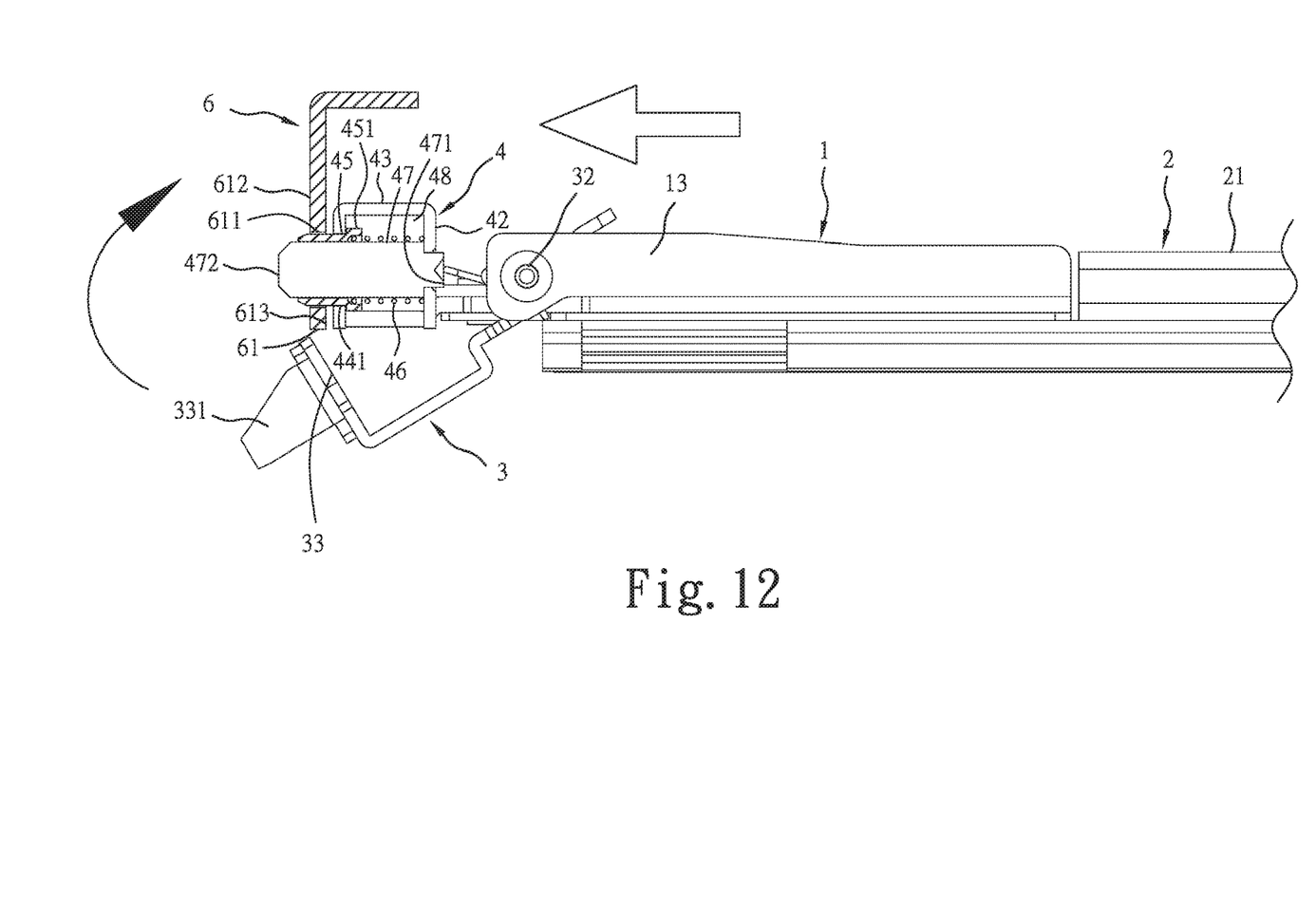
FIG. 12 is a schematic partial cross-sectional top view illustrating the swivel buckle of the assembly in FIG. 11 biased and opened, and having the sockets inserted into respective large locating holes of the server rack.

To mount the server sliding rail assembly 2 to a server rack 6' with small locating holes, the lever 331 is biased to disengage the swivel buckle 3 from the connecting seat 4 (see FIGS. 6 and 8), the locating pins 47 then are inserted into respective small locating holes 611' on a rack wall 61' of the server rack 6' (see FIG. 8) to enable the coil springs 46 to be compressed by the respective sockets 45 (see FIG. 9), and the fourth wall 44 of the connecting seat 4 then is forced into abutment against a back surface 613' of the rack wall 61' of the server rack 6' (see FIG. 10), and the swivel buckle 3 then is released to enable the hook plate 33 to hook on an opposing front surface 612' of the rack wall 61' of the server rack 6' (see FIG. 10).

To dismount the server sliding rail assembly 2 from the server rack 6 or 6', the lever 331 is biased to disengage the hook plate 33 from the server rack 6 or 6', to allow removal of the sockets 45 or locating pins 47 of the connecting seat 4 from the large locating holes (for example, square locating holes) 611 or small locating holes (for example, circular locating holes) 611' of the server rack 6 or 6'.

In conclusion, the invention has the advantages and features as follows.

After installation, the fourth wall 44 of the connecting seat 4 is abutted against the back surface 613, 613' of the rack wall 61, 61' of the server rack 6, 6', the hook plate 33 of the swivel buckle 3 is hooked on the front surface 612, 612' of the rack wall 61, 61' of the server rack 6, 6', and the sockets 45 or locating pins 47 are respectively engaged into the rack wall 61, 61' of the server rack 6, 6', enhancing connection stability.

The swivel buckle 3 can be biased and disconnected from the rack wall 61, 61' of the server rack 6, 6' conveniently without tools.

By means of the sockets 45 or locating pins 47 of the connecting seat 4, the connecting seat 4 can be fastened to large locating holes (for example, square locating holes) 611 or small locating holes (for example, circular locating holes) 611' of a server rack 6 or 6'.

Although a particular example embodiment of the present invention has been described in detail for purposes of illustration, various modifications and advancements may be made without departing from the spirit and scope of the invention. Accordingly, the invention is not to be limited except as by the appended claims.

What is claimed is:

1. A server sliding rail assembly front bracket quick release structure, comprising:
   a front bracket comprising a base wall, upper and lower walls respectively connected to opposing upper and lower sides of said base wall, said base wall being configured to be connected to a front side of an outer sliding rail of a server sliding rail assembly;
   a connecting seat comprising a first wall fixedly connected to the base wall of said front bracket, a second wall perpendicularly connected at a bottom side thereof to a rear side of said first wall, a third wall perpendicularly connected to an opposing top side of said second wall, a fourth wall perpendicularly connected to said third wall, an accommodation chamber defined between said fourth wall and said second wall, a plurality of locating holes through said fourth wall, and a plurality of holes through said second wall;
   a plurality of sockets respectively disposed in said accommodation chamber between said second wall and said fourth wall, each said socket comprising a stop flange extended around the periphery thereof and stopped at an inner surface of said fourth wall around one respective said locating hole;
   a plurality of coil springs respectively supported between said sockets and said second wall within said accommodation chamber to force the respective said sockets into the respective said locating holes through said fourth wall;
   a plurality of locating pins respectively inserted through said sockets and said coil springs, each said locating pin having one end thereof fastened to one respective said hole through said second wall and an opposite end thereof extended out of one respective said locating hole through said fourth wall;
   a swivel buckle comprising two lugs bilaterally disposed at a rear side thereof and respectively pivotally connected to said upper and lower walls of said front bracket with a pivot member, a hook plate located at an opposing front side of said swivel buckle, and a lever extended from said hook plate; and
   a torsion spring mounted around said pivot member to force said swivel buckle into abutment against said connecting seat, said torsion spring having one side stopped against said swivel buckle and an opposite side thereof stopped against said first wall of said connecting seat.

2. The server sliding rail assembly front bracket quick release structure of claim 1, further comprising:
   a plurality of first holes through said base wall of said front bracket used to connect said base wall to the front side of the outer sliding rail of the server sliding rail assembly via first rivets, and a plurality of third holes through said base wall at a front side relative to said first holes through the base wall;
   a plurality of second holes through said first wall of the connecting seat used to respectively fixedly connect said first wall of the connecting seat to said base wall at said third holes through said front bracket via second rivets.

3. The server sliding rail assembly front bracket quick release structure of claim 1, wherein the hook plate is adapted for hooking on a front side of a rack wall of a server rack after insertion of said sockets or locating pins into respective locating holes on said rack wall of said server rack.

4. The server sliding rail assembly front bracket quick release structure of claim 1, wherein the lever extended from said hook plate is usable to bias said swivel buckle relative to said front bracket.

5. The server sliding rail assembly front bracket quick release structure of claim 1, wherein to mount said server sliding rail assembly to a server rack, the lever is biased to disengage said swivel buckle from said connecting seat, said sockets or said locating pins then are inserted into respective locating holes on the rack wall of the server rack, and said fourth wall of said connecting seat then is forced into abutment against a back surface of the rack wall of the server rack, and said swivel buckle then is released to enable said hook plate to hook on an opposing front surface of the rack wall of the server rack.

6. The server sliding rail assembly front bracket quick release structure of claim 5, further wherein to dismount said server sliding rail assembly from the server rack, said lever is biased to disengage said hook plate from the server rack to allow removal of said sockets or said locating pins of said connecting seat from the locating holes of the server rack.

7. A server sliding rail assembly front bracket quick release structure, comprising:
- a front bracket comprising a base wall, upper and lower walls respectively connected to opposing upper and lower sides of said base wall, a plurality of first holes through said base wall used to connect said base wall to a front side of an outer sliding rail of a server sliding rail assembly via first rivets, and a plurality of third holes through said base wall at a front side relative to said first holes through the base wall;
- a connecting seat comprising a first wall, a plurality of second holes through said first wall used to respectively fixedly connect said first wall to said base wall at said third holes through said front bracket via second rivets, a second wall perpendicularly connected at a bottom side thereof to a rear side of said first wall, a third wall perpendicularly connected to an opposing top side of said second wall, a fourth wall perpendicularly connected to said third wall, an accommodation chamber defined between said fourth wall and said second wall, a plurality of locating holes through said fourth wall, and a plurality of fourth holes through said second wall;
- a plurality of sockets respectively disposed in said accommodation chamber between said second wall and said fourth wall, each said socket comprising a stop flange extended around the periphery thereof and stopped at an inner surface of said fourth wall around one respective said locating hole;
- a plurality of coil springs respectively supported between said sockets and said second wall within said accommodation chamber to force the respective said sockets into the respective said locating holes through said fourth wall;
- a plurality of locating pins respectively inserted through said sockets and said coil springs, each said locating pin having one end thereof fastened to one respective said fourth hole through said second wall and an opposite end thereof extended out of one respective said locating hole through said fourth wall;
- a swivel buckle comprising two lugs bilaterally disposed at a rear side thereof and respectively pivotally connected to said upper and lower walls of said front bracket with a pivot member, a hook plate located at an opposing front side of said swivel buckle and adapted for hooking on a front side of a rack wall of a server rack after insertion of said sockets or locating pins into respective locating holes on the rack wall of the server rack, and a lever extended from said hook plate for operation by the user to bias said swivel buckle relative to said front bracket; and
- a torsion spring mounted around said pivot member to force said swivel buckle into abutment against said connecting seat, said torsion spring having one side stopped against said swivel buckle and an opposite side thereof stopped against said first wall of said connecting seat;
- wherein to mount said server sliding rail assembly to the server rack, the lever is biased to disengage said swivel buckle from said connecting seat, said sockets or said locating pins then are inserted into respective locating holes on the rack wall of the server rack, said fourth wall of said connecting seat then is forced into abutment against a back surface of the rack wall of the server rack, and the swivel buckle then is released to enable said hook plate to hook on an opposing front surface of the rack wall of the server rack; and
- wherein to dismount said server sliding rail assembly from said server rack, said lever is biased to disengage said hook plate from the server rack to allow removal of said sockets or said locating pins of said connecting seat from the locating holes of the server rack.

* * * * *